United States Patent [19]
Ellul et al.

[11] Patent Number: 5,614,750
[45] Date of Patent: Mar. 25, 1997

[54] BURIED LAYER CONTACT FOR AN INTEGRATED CIRCUIT STRUCTURE

[75] Inventors: Joseph P. Ellul, Nepean; John M. Boyd, Woodlawn, both of Canada

[73] Assignee: Northern Telecom Limited, Montreal, Canada

[21] Appl. No.: 496,650

[22] Filed: Jun. 29, 1995

[51] Int. Cl.$^6$ ............... H01L 29/76; H01L 29/94; H01L 27/082; H01L 27/102

[52] U.S. Cl. ............ 257/386; 257/397; 257/586; 257/588

[58] Field of Search ................... 257/386, 565, 257/586, 587, 588, 394, 397, 510

[56] References Cited

U.S. PATENT DOCUMENTS 5,001,538  3/1991  Pollock et al. ............... 257/386
5,286,996  2/1994  Neudeck et al. ............... 257/565

*Primary Examiner*—Carl Whitehead, Jr.
*Attorney, Agent, or Firm*—Angela C. de Wilton

[57] ABSTRACT

A buried layer contact for a integrated circuit structure is provided, with particular application for a contact for a buried collector of a bipolar transistor. The buried layer contact takes the form of a sinker comprising a fully recessed trench isolated structure having dielectric lined sidewalls and filled with conductive material, e.g. doped polysilicon which contacts the buried layer. The trench isolated contact is more compact than a conventional diffused sinker structure, and thus beneficially allows for reduced transistor area. Advantageously, a reduced area sinker reduces the parasitic capacitance and power dissipation. In a practical implementation, the structure provides for an annular collector contact structure to reduce collector resistance.

15 Claims, 8 Drawing Sheets

BURIED LAYER CONTACT FOR AN INTEGRATED CIRCUIT STRUCTURE

FIELD OF THE INVENTION

This invention relates to a buried layer contact for an integrated circuit structure, and a method of fabrication thereof, with particular application for a sinker structure for a bipolar integrated circuit.

BACKGROUND OF THE INVENTION

In conventional integrated circuit technology, one of the requirements of a high performance bipolar CMOS integrated circuit structure is to provide a contact to a heavily doped buried layer in a silicon substrate. Typically this is achieved by a high dose, high energy ion implantation into the substrate surface, followed by diffusion, i.e. annealing at an elevated temperature, for a time sufficient to allow the implanted dopant to reach the buried layer.

For example, a typical known structure for a bipolar transistor formed in an epitaxial surface layer of a semiconductor, comprises a heavily doped buried layer of semiconductor material which forms a buried collector electrode, and a contact to the buried layer, commonly called a sinker, is provided in a sinker region adjacent to a device well region in which are defined base and emitter structures of the transistor. The sinker region is isolated from the surrounding surface regions by part of a field oxide layer. A conventional sinker is formed after forming device wells and field isolation regions. The sinker region is patterned, i.e. by masking with photoresist so that only the sinker regions are exposed, and then the sinker is formed by ion implantation and diffusion sufficiently deep into the substrate that the implanted diffused layer reaches the buried layer, and thus forms a conductive contact with the buried layer. Thus a long and/or high temperature anneal is required to diffuse the sinker implant to reach a deep buried layer. The large thermal budget may cause unwanted diffusion in other layers, and is not desirable in a scaled back process. The requirement for deep diffusion may introduce process bias to the lateral dimensions of the sinker structure, i.e. causes lateral diffusion of the implanted sinker, which substantially increases the area of the sinker, and thus increases the minimum sinker to base separation required. Also, the resulting collector-substrate and collector-base capacitances, and collector resistance may be higher than desirable for reduced dimension devices.

SUMMARY OF THE INVENTION

Thus, the present invention seeks to provide an integrated circuit structure and a method of fabrication of an integrated circuit structure, which avoid or reduce the above-mentioned problems.

According to one aspect of the present invention there is provided an integrated circuit structure on a semiconductor substrate having a surface and comprising a heavily doped buried layer and an overlying semiconductor layer, a device well region defined in the semiconductor layer overlying the heavily doped buried layer and a contact to the buried layer comprising:

a steep sided trench region defined in the device well region and extending from the substrate surface through the semiconductor layer to the buried layer, sidewalls of the trench region being lined with dielectric and a conductive material filling the trench and forming an electrically conductive contact with the underlying heavily doped buried layer.

Thus a buried layer contact structure for contacting a buried layer of an integrated circuit is provided in the form of a fully recessed, trench isolated structure. The contact structure is conveniently formed by a deep steep sided trench, provided with dielectric sidewall spacers, and filled with a conductive layer, for example, doped polysilicon or amorphous silicon, or other conductive material that can withstand subsequent process steps. Optionally, before filling the trench, the bottom of the trench is heavily doped by ion implantation, to improve electrical contact between the conductive layer filling the trench and the buried layer. The structure is characterized by a low resistance, and is readily integrated into known integrated circuit fabrication processes. The buried layer contact structure may, for example, provide a sinker for buried collector of a bipolar transistor. The sinker structure is compact and takes up a reduced area relative to a conventional diffused sinker structure. Advantageously, a reduced area sinker for a bipolar transistor reduces the parasitic capacitance and power dissipation. Moreover, with a more compact structure, it is then practical to provide a sinker of annular form, which improves isolation from the substrate, and reduces collector resistance.

According to another aspect of the present invention there is provided an integrated circuit formed on a substrate comprising a semiconductor substrate, a heavily doped buried layer and an overlying semiconductor layer, isolation regions defining a device well region of the semiconductor layer, and a bipolar transistor structure defined in the device well region comprising a base region, and an emitter forming an emitter-base junction therewith, part of the underlying buried layer within the device well forming a buried collector electrode, and a contact to the buried collector electrode in the form of a sinker structure comprising:

a trench extending from the substrate surface to the buried layer, sidewalls of the trench being lined with an dielectric layer and a conductive material filling the trench, the conductive material contacting the buried layer in the bottom of the trench and thereby forming an electrically conductive contact to the buried collector.

Preferably the isolation regions comprise deep trench isolation extending from the substrate surface through the buried layer into the substrate. The trench region forming the sinker structure is defined within the device well region spaced from the isolation regions, or preferably, adjacent the isolation regions, to reduce the transistor area. Advantageously, the trench region surrounds the device well region wherein the transistor is formed, to provide a sinker is of annular form, and a deep isolation trench surrounds the trench forming the annular sinker. Beneficially, the conductive layer filling the trench is recessed below the surface of the substrate and the top of the trench is filled with dielectric coplanar with the substrate surface, to provide a planarized structure which allows for routing of interconnect conductors over the sinker trench.

According to yet another aspect of the present invention there is provided a method of fabrication of an integrated circuit structure on a semiconductor substrate having a buried layer, comprising:

providing a semiconductor substrate comprising a heavily doped buried layer and an overlying semiconductor layer;

forming dielectric isolation regions to define a device well region in the semiconductor layer;

defining a trench extending from the substrate surface to the heavily doped buried layer within the device well region;

lining sidewalls of the trench with a layer of dielectric;

filling the trench with a conductive material, thereby forming an electrically conductive contact with the buried layer;

and planarizing the resulting structure.

Advantageously, the method provides for forming a fully recessed, trench isolated sinker using a lower thermal budget than conventional known processes for a diffused sinker. Moreover, the sinker structure may be incorporated early in a process when the thermal budget restraints are less stringent.

Preferably, lining sidewalls of the trench comprises forming dielectric sidewall spacers, and the trench is filled with a conductive material comprising heavily doped polysilicon or amorphous silicon. Dielectric sidewall spacers are formed by a conventional method of depositing a conformal layer of dielectric followed by anisotropic etching to expose the bottom of the trench. Optionally, the bottom of the trench is heavily doped by ion implantation to facilitate formation of a good contact between the buried layer and the conductive material filling the trench. Filling of the trench is conveniently accomplished by deposition of conformal layers of conductive material therein, followed by planarization, preferably by chemical mechanical polishing to provide a fully planarized structure. A step of selective etching to recess the conductive material within the trench, and refilling the trench with dielectric provides a fully planarized structure which allows for routing of interconnect conductors across the top of the trench.

Thus, there is provided an integrated circuit structure with a buried layer contact and a method of fabrication of the structure, with particular application to formation of a sinker for a bipolar transistor structure.

BRIEF DESCRIPTION OF THE DRAWINGS

Embodiments of the invention will now be described by way of example, with reference to the accompanying drawings, in which.

DESCRIPTION OF THE PREFERRED EMBODIMENTS

Figure 1:
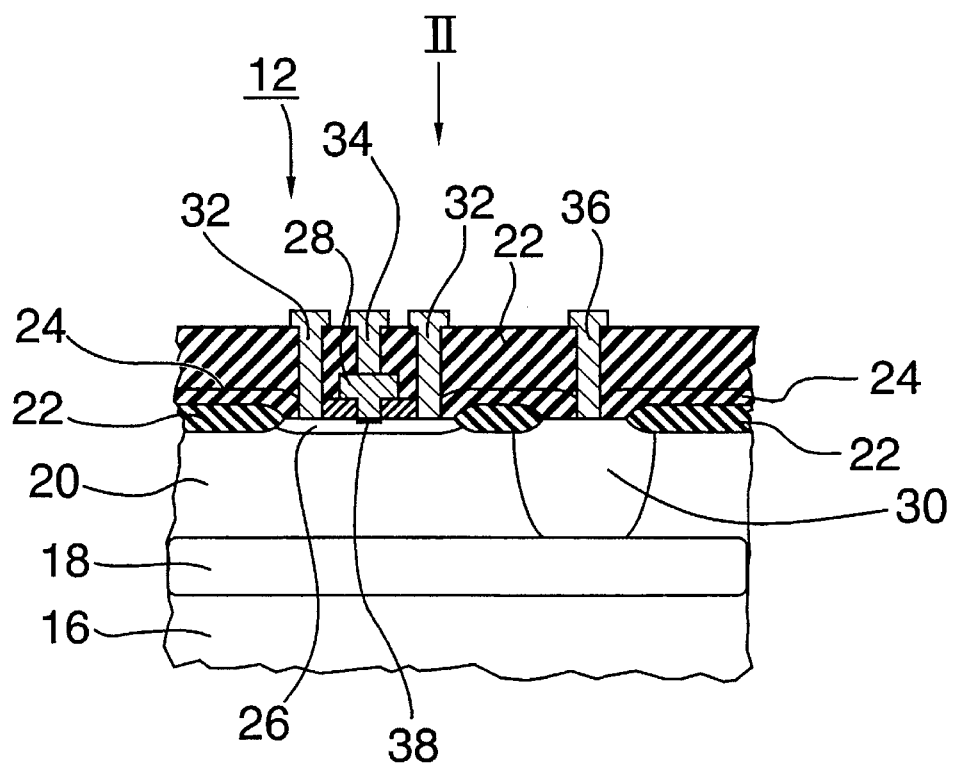
FIG. 1 shows a cross-sectional view through part of a prior art integrated circuit comprising a bipolar transistor having a diffused sinker structure.
Figure 2:
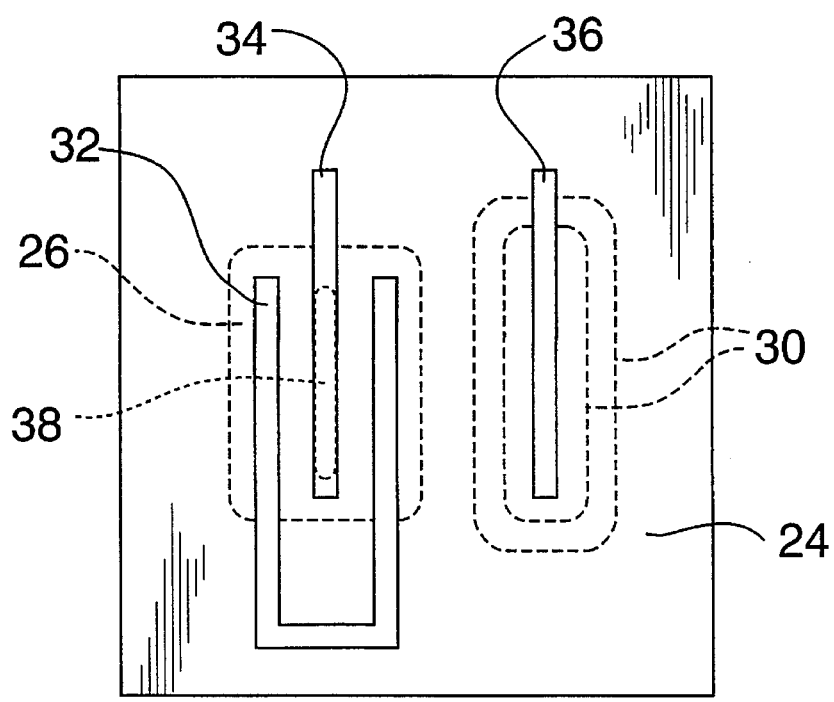
FIG. 2 shows a corresponding top plan view of the structure of FIG. 1 along arrow II.

Part of an integrated circuit 10 comprising a bipolar transistor 12 of a conventional known prior art structure, including a buried layer contact 30, typically known as a sinker, is shown in FIGS. 1 and 2. The transistor 12 is formed on a conventional semiconductor substrate 16, i.e. a silicon wafer, having a heavily doped buried layer 18 and an overlying epitaxial layer of relatively lightly doped silicon, part of which forms a device well region 20. A conventional field oxide isolation layer 22 is formed on the surface of the semiconductor layer and defines an opening for formation of base 26 and emitter 28 electrodes of the transistor, and an adjacent opening in which is defined a collector contact 30, in the form of a sinker. The sinker comprises a heavily doped, diffused region 30 which extends through the semiconductor layer 20 to contact the buried layer 18 which forms the buried collector electrode. Conductive contacts 32, 34 and 36 are formed through isolation layer 24 to the base, emitter and collector electrodes respectively. FIG. 2 shows a top view of the structure of FIG. 1, showing the layout of the base, emitter and collector contact metallization 32, 34, and 36 respectively.

Figure 3:
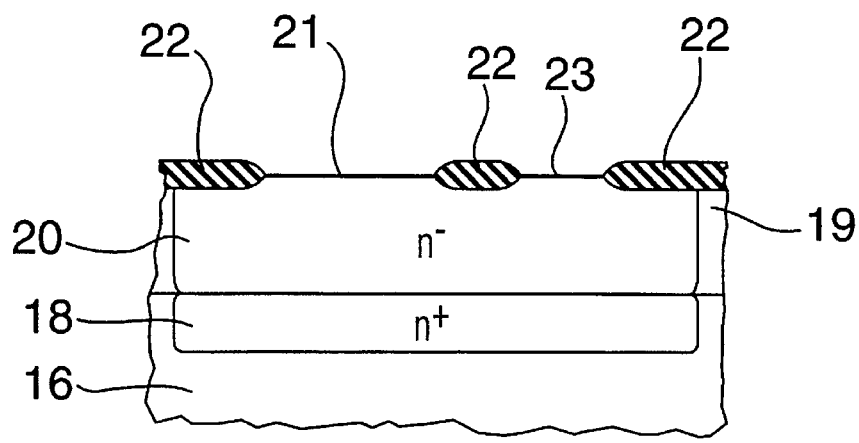
FIGS. 3, 4, and 5 show schematic cross-sectional views through a part of the prior art conventional integrated circuit structure of FIG. 1, at successive stages during fabrication.
Figure 4:
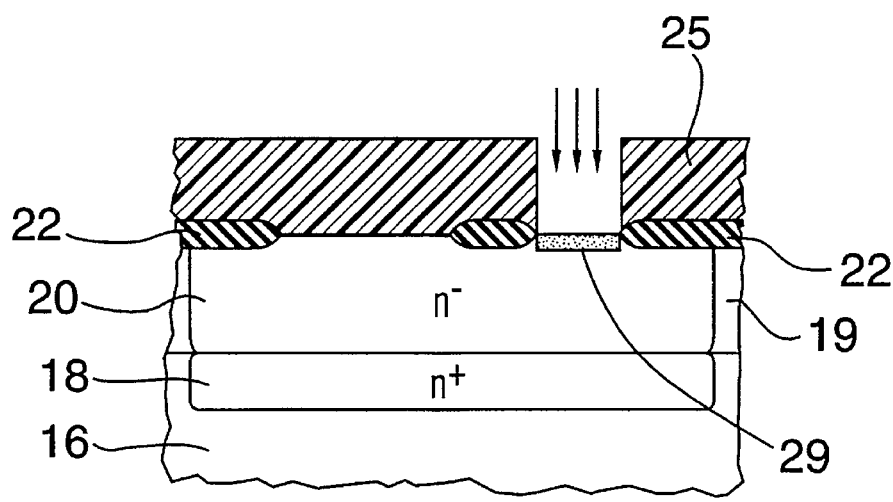
Figure 5:
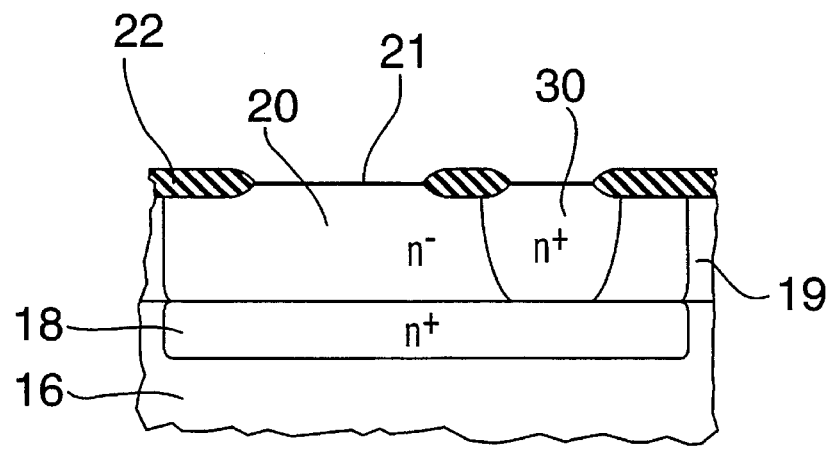

The structure of FIGS. 1 and 2 is shown in FIGS. 3 to 5 respectively at successive stages during fabrication by conventional known method steps. For example, as shown in FIG. 3, the substrate 16 is heavily implanted to form the heavily doped buried layer 18. An epitaxial layer of silicon 19 is then provided thereon and selectively doped to form device wells, e.g. the n-well 20, shown in FIG. 3. A field isolation layer 22 is then formed on the surface in a conventional manner, e.g. a layer of silicon dioxide formed by a LOCOS process. Openings 21 and 23 are defined for the device well region and for a sinker contact respectively. After selectively masking the surface with photoresist 25 to expose the sinker region of the substrate surface in opening 23 of the field oxide, a high dose, high energy implant is performed into the surface of the n-well 29 (FIG. 4). Annealing is then carried out at a sufficiently high temperature and for a sufficiently long time to diffuse the heavily doped sinker region downwards into region 30, thereby forming a contact with the buried layer 18 (FIG. 5). However, diffusion also occurs laterally as indicated schematically in FIG. 5, necessitating a relatively wide spacing of the sinker region from the adjacent device well regions.

Figure 6:
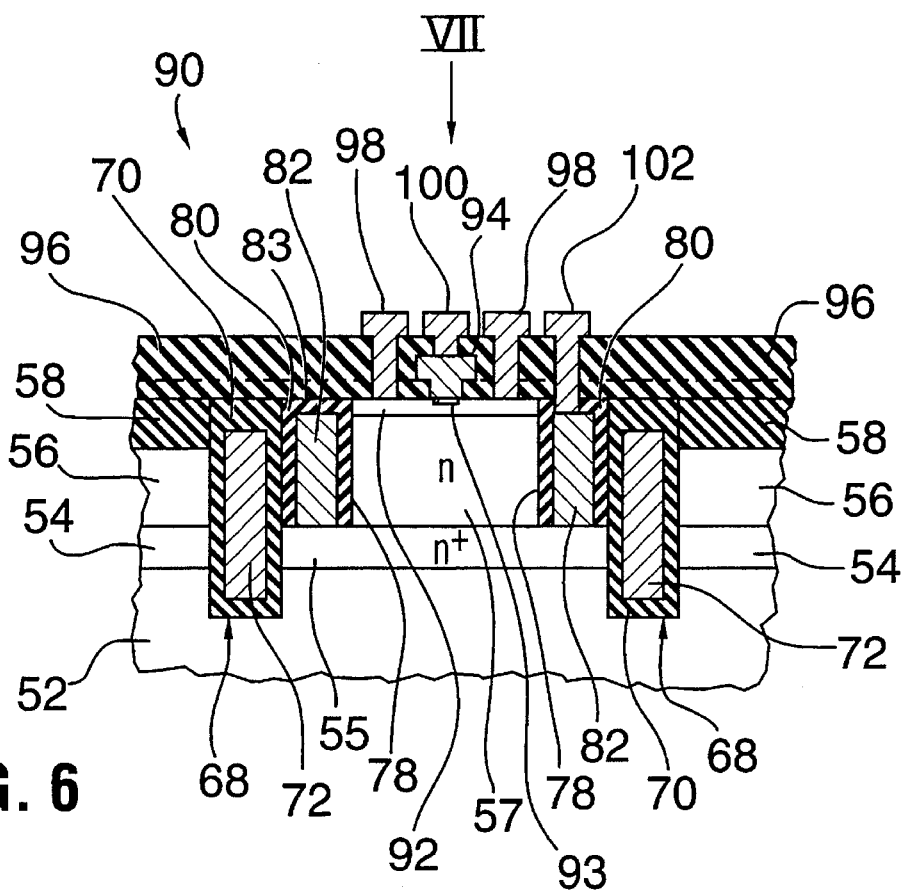
FIG. 6 shows a cross-sectional view of part of the integrated circuit comprising a transistor and a buried layer contact according to a first embodiment of the present invention.
Figure 7:
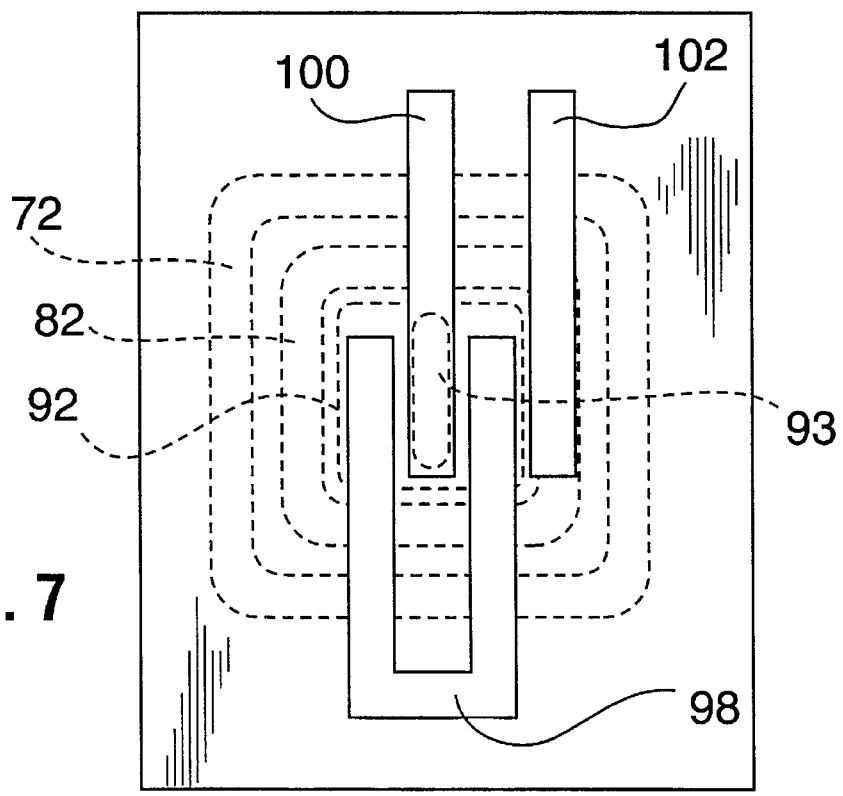
FIG. 7 shows a corresponding top plan view of the structure of FIG. 6 along arrow VI.

Part of an integrated circuit according to a first embodiment of the present invention is shown in cross-section in FIG. 6 and a corresponding plan view along arrow VII is shown in FIG. 7. The structure of FIG. 6 comprises a substrate 52 in the form of a conventional semiconductor silicon wafer, a heavily n doped buried layer 54 formed therein, and overlying epitaxial lightly n doped silicon layer 56. Shallow trench isolation 58 comprising silicon dioxide defines a device well area. Within the device well area, deep trench isolation regions 68 extend to the substrate below the buried layer 54. The deep isolation trenches 68 are lined with a dielectric layer 70 extending over the sidewalls and base of the trench, and filled with polysilicon 72. Part 55 of the heavily doped buried layer 54 is thus isolated within the deep trench isolation 68, and forms a collector electrode 55. Another trench structure 78 is defined to form a contact to the buried collector electrode 55. The trench 78 is lined with dielectric sidewall spacers 80, and filled with a conductive layer 82. The conductive layer 82 comprising heavily doped polysilicon, thus extends to the bottom of the trench and contacts the heavily doped buried layer 55 to form the collector contact with the buried layer. The contact to the buried layer thus takes the form of a sinker defined within a trench 78 which surrounds, and encloses the device well region 57 in which other elements of a bipolar transistor 90 are formed in a conventional manner. That is, the bipolar transistor 90 comprises a base region 92 defined by selectively doped regions in the substrate surface, a polysilicon emitter structure 94 forming an emitter-base junction 93, and dielectric isolation 96. The annular structure of the sinker trench 78 surrounding the base region 92 can be seen in outline in the top view of the schematic structure in FIG. 7, which also shows how the deep trench isolation surrounds the sinker trench. Interconnect metallization 98 and 100 for contacting the base 92 and emitter electrode 94 is provided in a conventional manner. A contact 102, is provided to the conductive layer 82 in the sinker trench 78. In the top of the sinker trench 78, the conductive layer 82 filling the sinker trench is recessed below the substrate surface, and the trench is filled with dielectric 81. Thus, as shown in FIG. 7, interconnect metallization can be conveniently routed over the sinker trench, as required.

Figure 8:
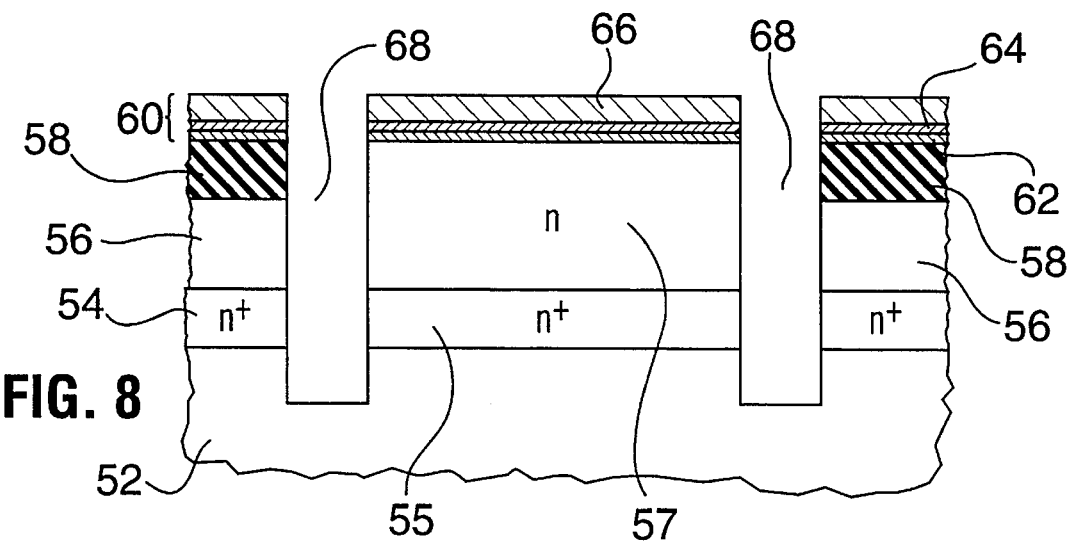
FIGS. 8 to 15 show schematic cross-sectional views through a part of the integrated circuit structure of FIG. 6 at successive stages during fabrication according to a first embodiment of the present invention.

In a method of forming the structure according to the first embodiment, as illustrated schematically in FIGS. 8 to 15, a semiconductor substrate, i.e. a conventional silicon wafer 52, is provided with a heavily doped buried layer 54 and an overlying epitaxial silicon layer 56, formed in a conventional manner. For example the layer 54 is heavily n doped and layer 56 is relatively lightly n-doped to form an n-well region. Field isolation is provided by a known shallow trench isolation process to form silicon dioxide dielectric filled trenches 58 surrounding a device well opening in region 57. The structure is provided with a trench masking layer 60 which may comprise, e.g. a multilayer stack of a chemical mechanical polish resistant layer 62, an intermediate layer 64 and an oxide etch mask layer 66. Deep trench isolation regions are formed by etching a deep trench 68 extending through the heavily doped buried layer 54 into the substrate 52 (FIG. 8). The trench is lined with a layer of dielectric 70, e.g. silicon dioxide, and then filled with polysilicon 82, to isolate the device well region. As shown in FIG. 6 and 7 the trench 68 has an annular form surrounding the device well region 57.

Figure 9:
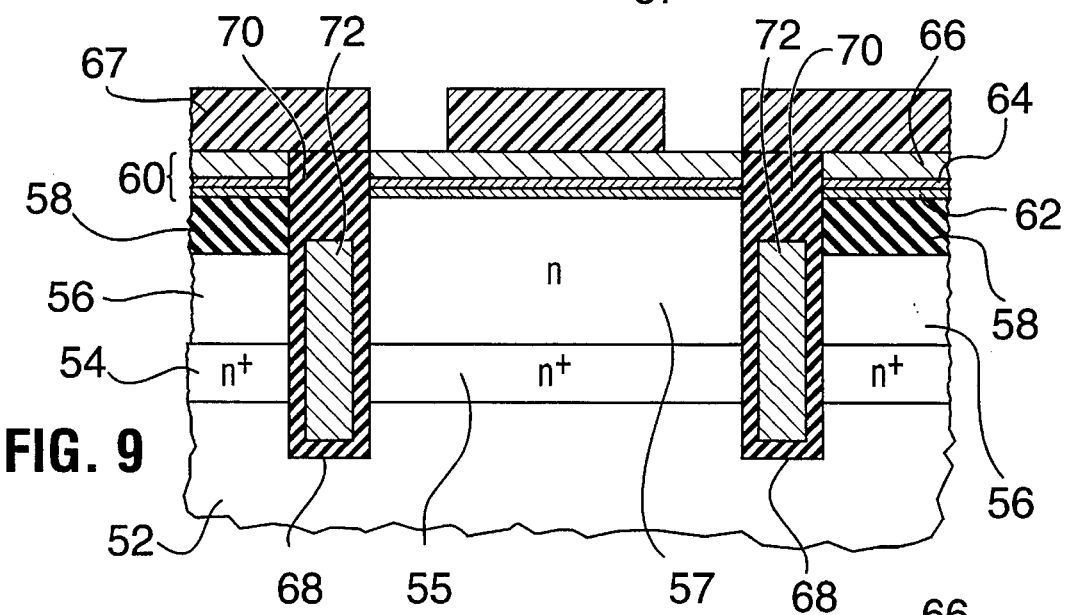
Figure 10:
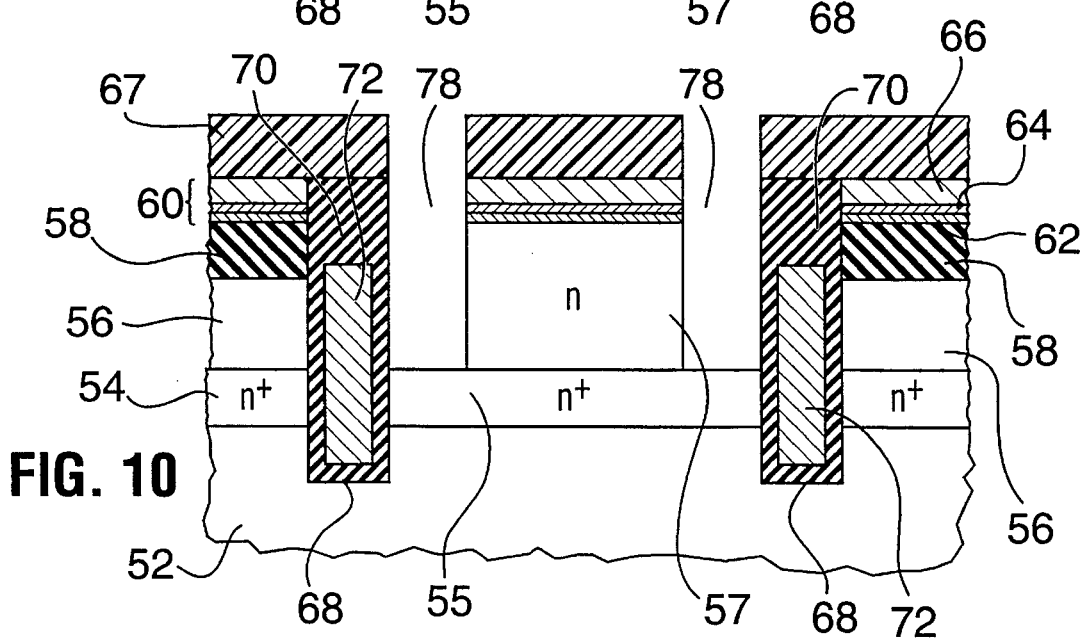
Figure 11:
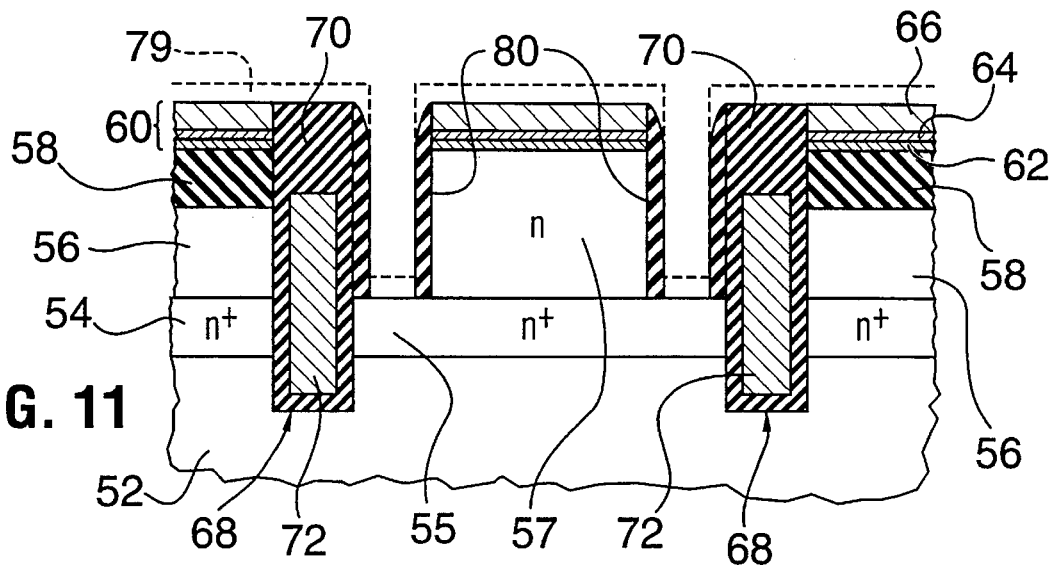
Figure 12:
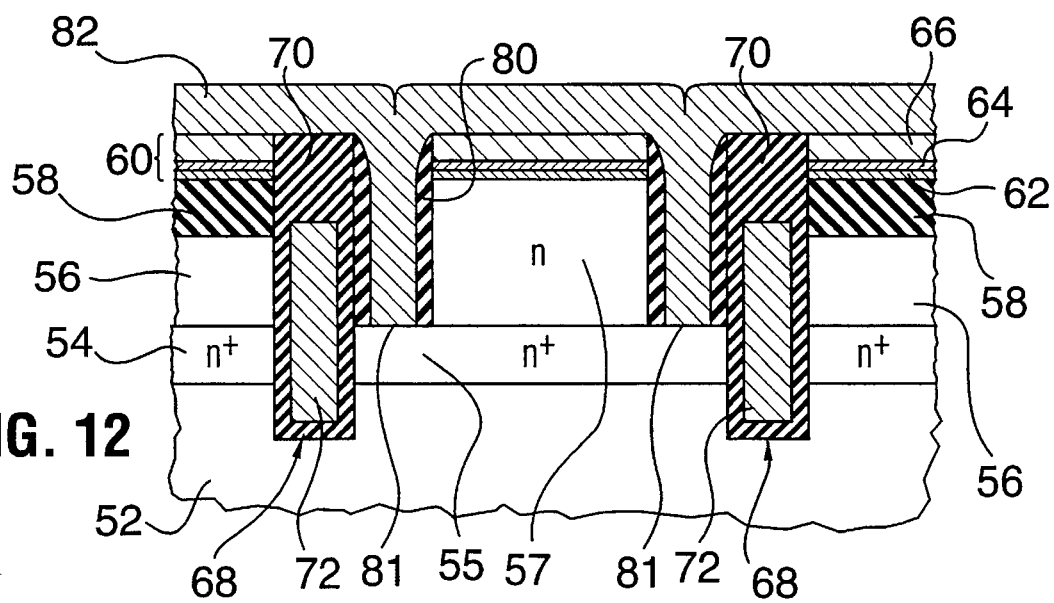
Figure 13:
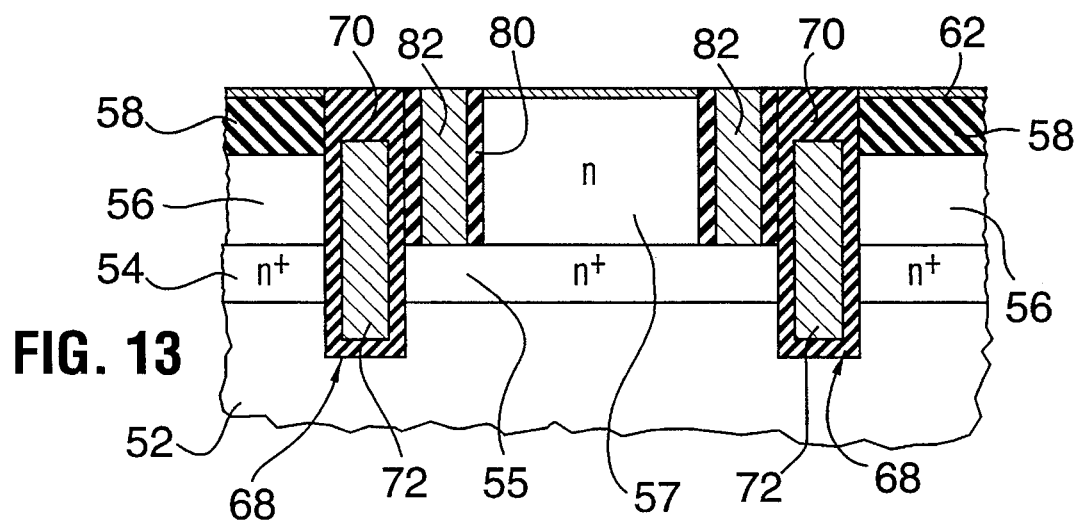
Figure 14:
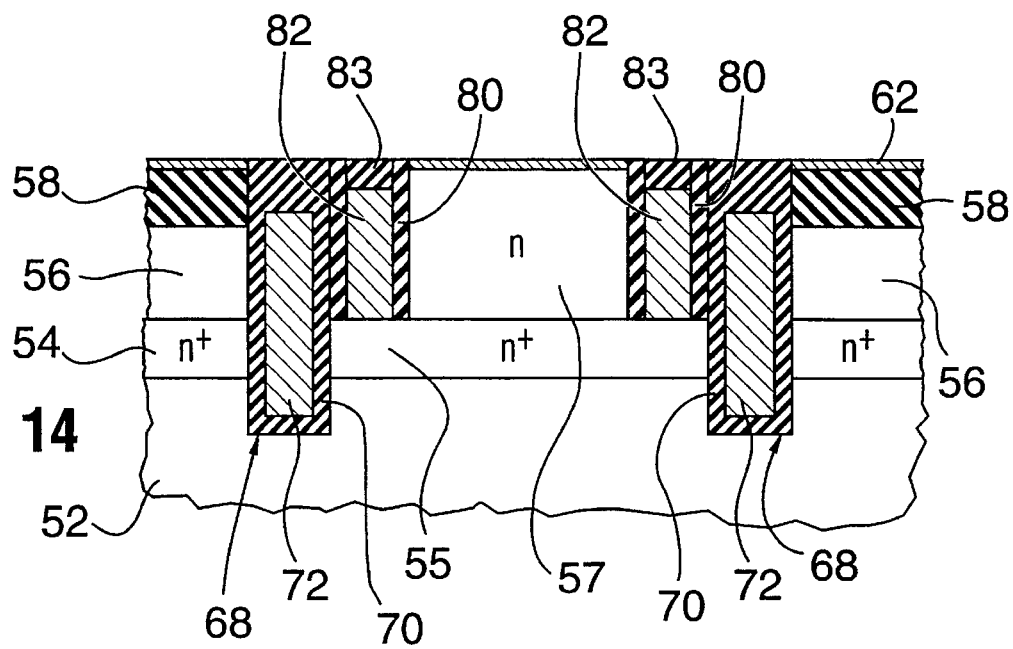
Figure 15:
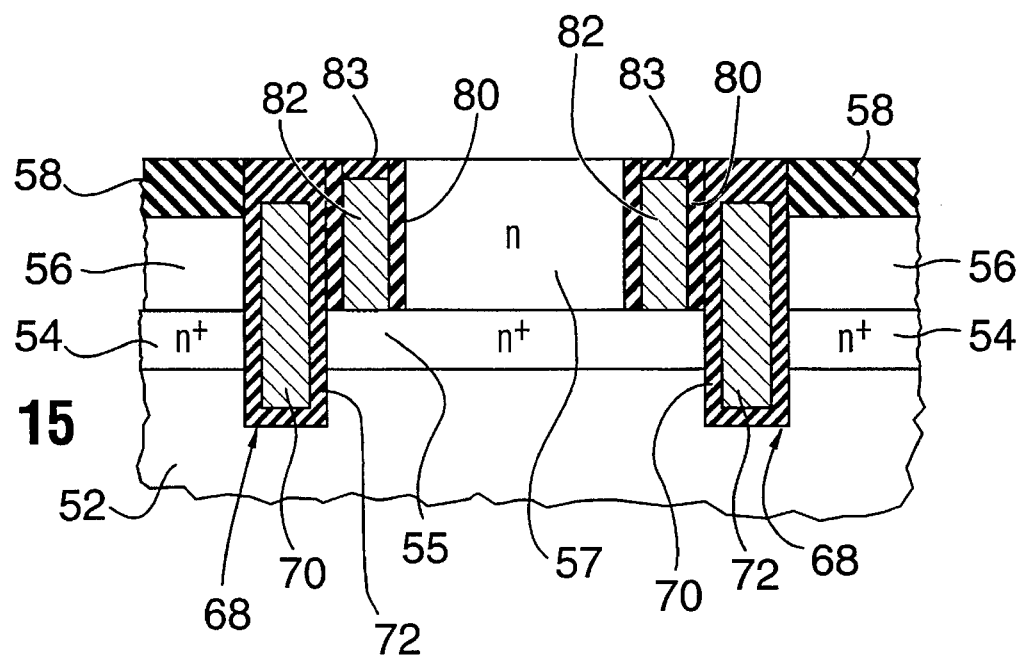
Figure 16:
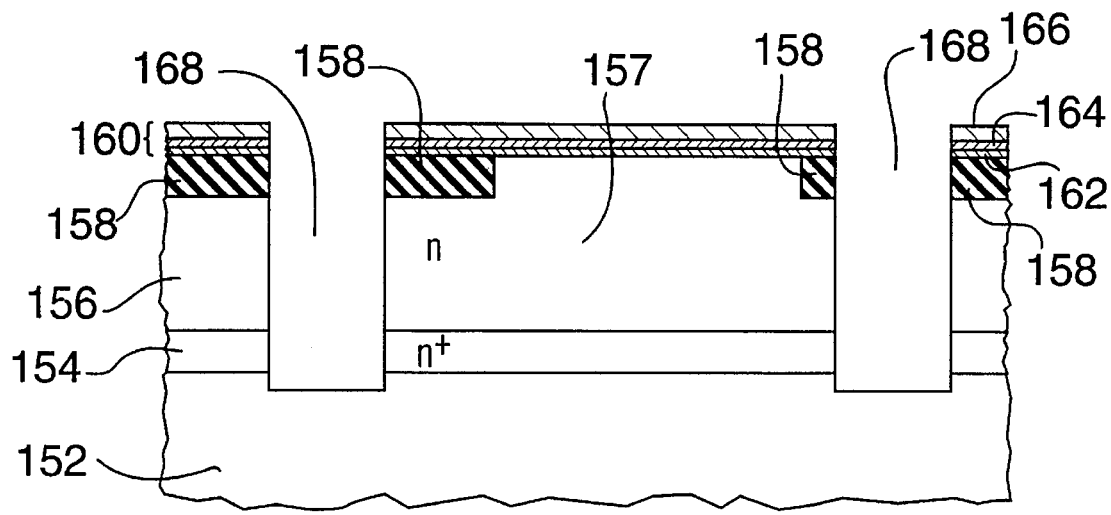
FIGS. 16 to 21 show schematic cross-sectional views at successive stages during fabrication of part of an integrated circuit according to a second embodiment of the present invention.

Subsequently, the structure is again selectively masked with a layer of photoresist 67 to leave an opening in the region where a sinker trench is to be defined (FIG. 9). A sinker trench 78 is then etched anisotropically into the substrate, and extends through the device well to the buried layer 55 (FIG. 10). The sinker trench 78 has an annular form, surrounding the device well region 57. After removing the masking layer 67, a conformal layer 79 of dielectric, e.g. silicon dioxide, is deposited overall. Parts of the layer of dielectric 79 are then selectively removed by an anisotropic etch to leave sidewall spacers 80 within the trench 78, and expose the underlying layer 55 within the bottom of the trench 68 (FIG. 11). Then the trench is filled with a conductive layer 82, i.e. heavily doped amorphous or polycrystalline silicon (FIG. 12). Optionally, before filling the trench, the bottom of the trench is ion implanted to increase the doping at the bottom 81 of the trench and thereby ensure good contact between the buried layer 55 and the conductive material 82 filling the trench. The trench is conventionally filled by depositing a conformal layer of polysilicon or amorphous silicon overall, thereby conformally filling the trench. The excess silicon is then removed from the surface of the substrate, preferably by chemical mechanical polishing to remove all layers extending above the polish stop layer 62, leaving a fully planarized surface (FIG. 13). The polysilicon 82 within the trench is then selectively etched to remove the polysilicon from the top of the trench and recess the surface of the conductive material 82 below the surface. The top of the trench is then filled with dielectric 83 and planarized (FIG. 14). The substrate is shown in FIG. 15 after planarizing and removing the polish stop layer 62. Device structures are then defined in the device well 57, e.g. a bipolar transistor as shown in FIG. 6. After completing elements of the transistor and providing a dielectric layer thereon, contacts vias are opened to devices and filled with conductive material, i.e. interconnect metallization 98, 100 respectively, to form a structure as shown in FIGS. 6 and 7. Interconnect 102 is provided to the sinker 82 for contacting the buried collector electrode 55.

Thus a buried layer contact 82 is provided which takes the form of a sinker comprising a fully recessed trench isolated structure. Formation of the sinker is decoupled from other steps of the process to allow for its formation at an early stage in processing, when thermal budget restraints are less stringent.

This method provides for a much more compact structure than a diffused sinker, which allows for a much reduced transistor area. Lateral diffusion of the conductive layer is limited by the dielectric lined trench.

Beneficially, the more compact design of the sinker structure also allows for a fully enclosed structure taking the form of an annular sinker surrounding the device well in which a bipolar transistor is formed. An annular collector contact is beneficial for reducing the collector resistance, and isolating the bipolar transistor from the substrate.

Figure 17:
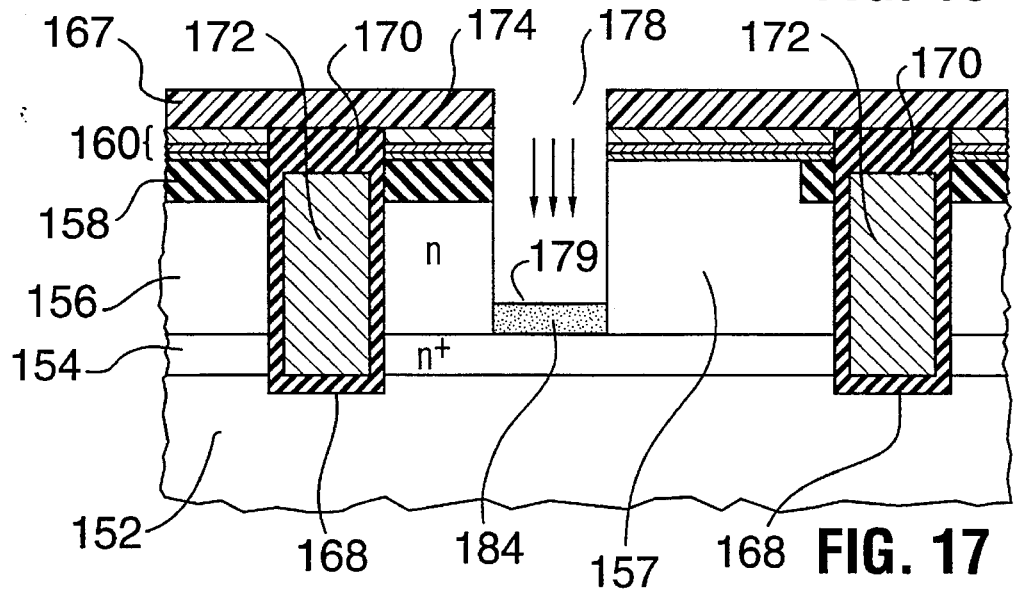
Figure 18:
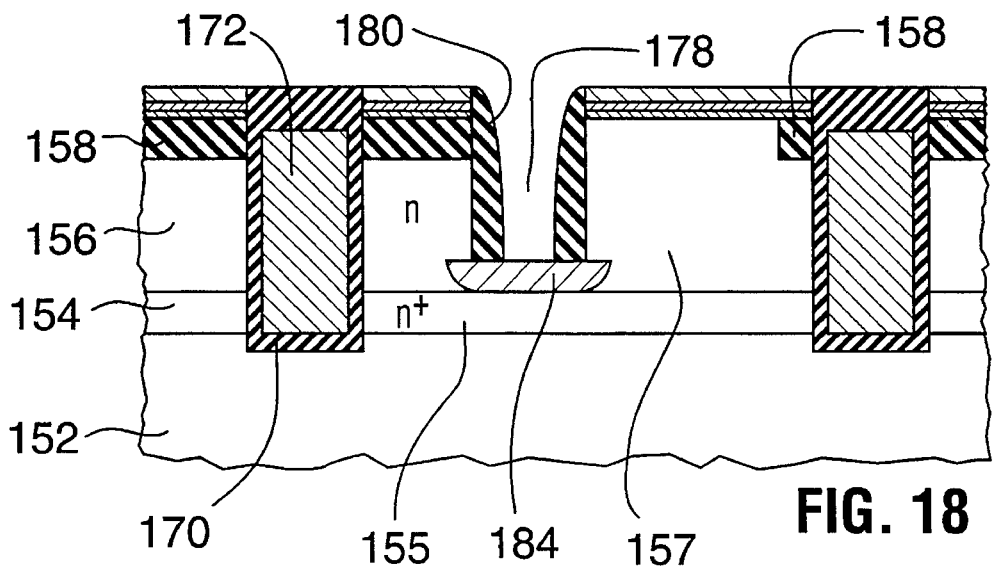
Figure 19:
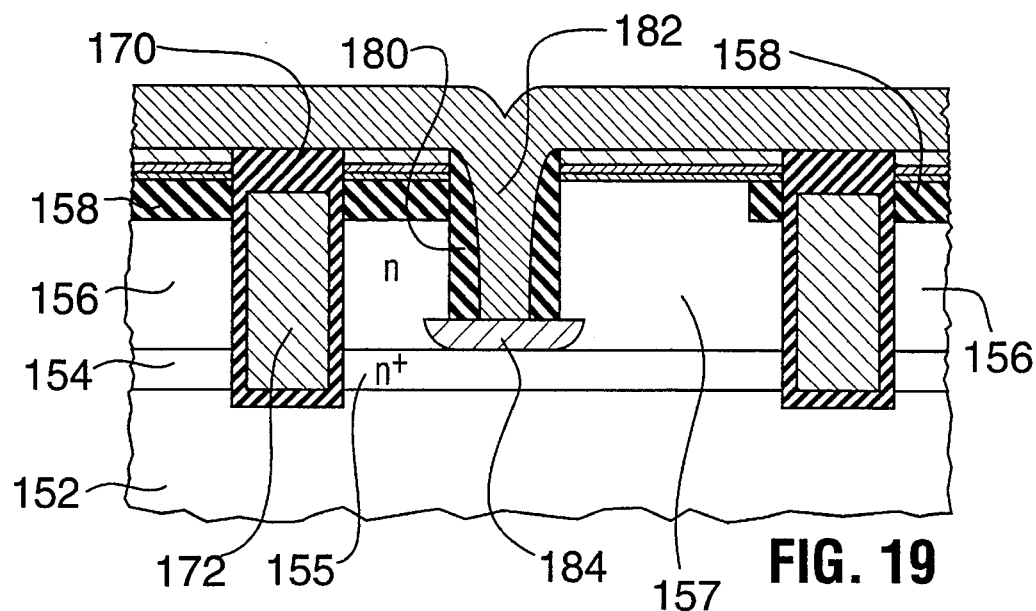
Figure 20:
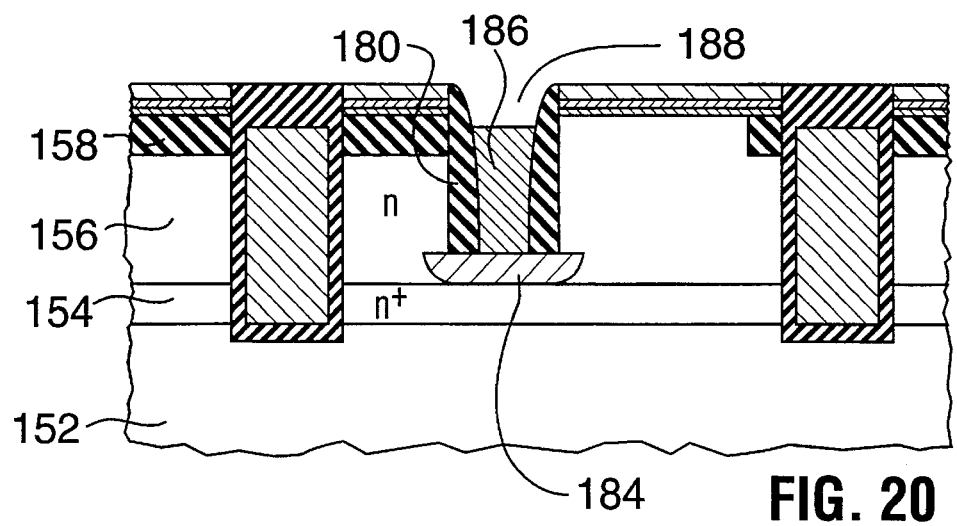
Figure 21:
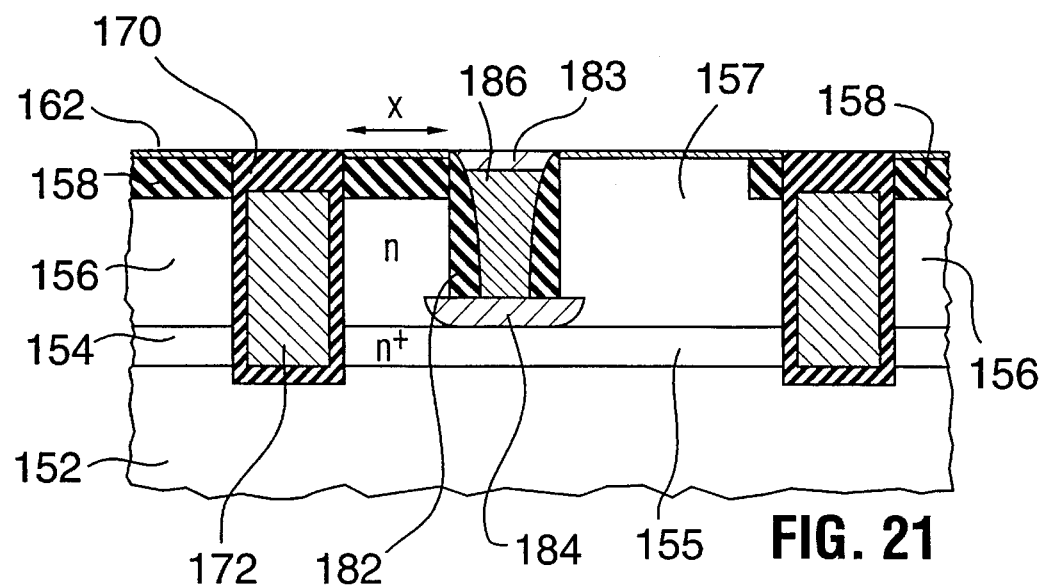

While the sinker is shown adjacent the isolation trench in FIGS. 8 to 15 illustrating the first embodiment, alternatively a buried layer contact according to a second embodiment, in which the sinker trench is spaced from the deep isolation trench, is shown in FIGS. 16 to 21. A substrate 152 is provided with a heavily doped buried layer 154, and an overlying epitaxial semiconductor layer 156 similar to that of the first embodiment. Isolation regions comprising shallow dielectric filled trenches 158, and deep trench isolation regions 168 define device well regions, i.e. region 157. A multilayer chemical mechanical resistant masking layer 160 is provided on the surface, and after patterning photoresist layer 167, a deep trench 178 is defined for forming the buried layer contact in the device well region 157 (FIG. 17). The trench 178 extends through the device well 157. The bottom 179 of the trench 178 is close to the buried layer. Optionally the trench 178 may be deep enough to expose the buried layer 155 as described in the first embodiment. An ion implant is then performed, and annealed, to heavily dope the device well region 184 at the bottom 179 of the trench 178 to ensure a good electrical contact is formed with the buried layer 155. Subsequently dielectric sidewall spacers 182 are formed in a conventional manner within the trench 178, and the trench 178 is filled with conductive material 182 as described in the first embodiment. For example, the conductive material comprises heavily doped polysilicon. After planarization (FIG. 17 to 18) by CMP, a subsequent selective etch removes a part of the conductive material 182 in the top of the trench and leaving part of the conductive material 186 recessed in the trench (FIG. 20). The top of the trench is then refilled with dielectric 183, and the structure is planarized again, as shown in FIG. 21. After removing the polish stop layer 162, active device structures, for example a bipolar transistor, are defined in the device well according to known methods. After formation of devices, a contact openings are defined and interconnection is provided to the conductive contact 186 for the buried electrode 155, in addition to the conventional contacts to device structures, i.e. to emitter and base electrodes of a bipolar transistor.

The sinker trench 178 may be spaced from the deep trench isolation 168 as shown in FIG. 17, or alternatively the silker trench may be placed adjacent to the deep trench 168 similar to the first embodiment.

Structures according to alternative embodiments provide buried layer contacts or sinkers for other device structures. Thus it will also be appreciated that while particular embodiments are described in detail, variations and modifications of these embodiments may be made within the scope of the following claims.

What is claimed is:

1. An integrated circuit structure on a semiconductor substrate comprising a heavily doped buried layer and an overlying semiconductor layer having a surface, a device well region defined in part of the semiconductor layer overlying the heavily doped buried layer and a contact to the buried layer comprising:

a steep sided trench region etched into the semiconductor layer and extending through the device well region from the surface of the semiconductor layer to the buried layer, with sidewalls of the trench region being lined with dielectric and a conductive material filling the trench and forming an electrically conductive contact with the underlying buried layer, the dielectric layer lining the trench thereby isolating the buried layer contact from the adjacent semiconductor layer forming the device well region.

2. A structure according to claim 1 wherein the dielectric lining the trench region comprises dielectric sidewall spacers.

3. A structure according to claim 1 wherein conductive material filling the trench comprises heavily doped polysilicon.

4. A structure according to claim 1 wherein conductive material filling the trench comprises heavily doped, amorphous silicon.

5. A structure according to claim 1 wherein a part of the semiconductor layer defining a bottom of the trench region is heavily doped to form an electrically conductive contact between the conductive layer filling the trench and the underlying buried layer.

6. A structure according to claim 1 wherein the device well region forms a collector region of a bipolar transistor and elements of the bipolar transistor comprising a base region and an emitter region are defined in the surface of the semiconductor layer forming the device well region, and the heavily doped buried layer underlying the collector region forms a buried collector electrode of the bipolar transistor, the buried layer contact extending through the collector region to contact the buried collector electrode of the bipolar transistor.

7. A structure according to claim 1 wherein the trench region surrounds the device well region whereby the buried layer contact has an annular form and encloses the device well region.

8. A structure according to claim 1 wherein the device well region is isolated by a deep isolation trench extending from the surface of the semiconductor layer through the heavily doped buried layer into the substrate, and the trench region forming the buried layer contacts is defined within the device well region adjacent the deep isolation trench.

9. A structure according to claim 1 wherein the device well region is isolated by deep isolation trenches extending into the substrate through the heavily doped buried layer, and trench region forming the buried layers contacts is formed within the device well region and spaced from the deep isolation trenches.

10. An integrated circuit formed on a substrate comprising a semiconductor substrate, a heavily doped buried layer and an overlying semiconductor layer having a surface, isolation regions defining a device well region of the semiconductor layer, and a bipolar transistor structure defined in the device well region comprising a base region formed in the surface of the semiconductor layer, and an emitter forming an emitter-base junction therewith, the underlying device well region forming a collector region, and part of the underlying buried layer within the device well forming a buried collector electrode, a contact to the buried collector electrode being provided in the form of a sinker structure comprising:

a trench etched through the semiconductor layer forming the device well and extending from the surface of the semiconductor layer to the buried layer, sidewalls of the trench being lined with an dielectric layer and a conductive material filling the trench, the conductive material contacting the buried layer in the bottom of the trench and thereby forming an electrically conductive contact through the collector region to the buried collector electrode.

11. A structure according to claim 10 wherein the isolation regions defining the device well region comprise deep trench isolation extending from the substrate surface through the buried layer into the substrate and wherein the trench forming the sinker structure is defined within the device well region adjacent the isolation regions.

12. A structure according to claim 10 wherein the isolation regions defining the device well region comprise deep trench isolation extending form the substrate surface through the buried layer into the substrate and wherein the trench forming the sinker structure is defined within the device well region spaced from the isolation regions.

13. A structure according to claim 10 wherein the trench surrounds the device well region wherein the transistor is formed, to provide a sinker of annular form.

14. A structure according to claim 13 wherein the conductive layer filling the trench is recessed below the surface of the semiconductor layer and the trench is filled with dielectric coplanar with the surface of the semiconductor layer.

15. A structure according to claim 14 comprising an overlying layer of dielectric and comprising contact openings through the overlying dielectric layers, the openings filled with conductive material to provide contacts to the emitter, base and sinker.

* * * * *